United States Patent
Miyazawa (10) Patent No.: US 10,763,802 B2
(45) Date of Patent: Sep. 1, 2020

(54) AMPLIFIER MODULE

(71) Applicant: SUMITOMO ELECTRIC DEVICE INNOVATIONS, INC., Yokohama-shi (JP)

(72) Inventor: Naoyuki Miyazawa, Yokohama (JP)

(73) Assignee: Sumitomo Electric Device Innovations, Inc., Yokohama-shi (JP)

( * ) Notice: Subject to any disclaimer, the term of this patent is extended or adjusted under 35 U.S.C. 154(b) by 30 days.

(21) Appl. No.: 16/168,965

(22) Filed: Oct. 24, 2018

(65) Prior Publication Data

US 2019/0123697 A1    Apr. 25, 2019

(30) Foreign Application Priority Data

Oct. 24, 2017 (JP) ................. 2017-205094

(51) Int. Cl.
*H03F 3/14* (2006.01)
*H03F 3/195* (2006.01)
*H03F 1/56* (2006.01)
*H01L 23/00* (2006.01)
(Continued)

(52) U.S. Cl.
CPC ............. *H03F 3/195* (2013.01); *H01L 23/66* (2013.01); *H01L 24/49* (2013.01); *H03F 1/0222* (2013.01); *H03F 1/0233* (2013.01); *H03F 1/56* (2013.01); *H01L 2223/6611* (2013.01);
(Continued)

(58) Field of Classification Search
CPC ...... H03F 3/195; H03F 1/0233; H03F 1/0222; H03F 1/56; H03F 2200/451; H03F 3/21; H03F 3/19; H03F 1/14; H03F 3/187; H03F 1/26; H03F 3/191; H03F 1/565; H01L 23/66; H01L 24/49; H01L 2924/00014; H01L 2223/6611; H01L 2223/6655; H01L 2223/6672; H01L 24/48; H01L 2224/49111; H01L 2224/48157; H01L 2224/49175; H01L 2224/48195;
(Continued)

(56) References Cited

U.S. PATENT DOCUMENTS 5,111,157 A * 5/1992 Komiak ................. H03F 3/604
                                                                 330/286
8,610,507 B2 * 12/2013 Ng ............................ H03F 1/56
                                                                 330/307
(Continued)

FOREIGN PATENT DOCUMENTS

JP    2016-019068 A    2/2016
JP    2017-103678 A    6/2017

*Primary Examiner* — Khanh V Nguyen
(74) *Attorney, Agent, or Firm* — Baker Botts L.L.P.; Michael A. Sartori (57) ABSTRACT

An amplifier module that implements two or more amplifying units connected in series is disclosed. The amplifier module includes a package, input and output terminals, two or more amplifying units including the first unit and the final unit, an output bias terminal for supplying an output bias to one of amplifying units except for the final unit, and an input bias terminal for supplying an input bias to another one of the amplifying units except for the first unit. A feature of the amplifier module is that the output bias terminal and the input bias terminal are disposed in axial symmetry with respect to a reference axis connecting the input terminal with the output terminal in one side of the package.

13 Claims, 6 Drawing Sheets

(51) Int. Cl.
*H03F 1/02* (2006.01)
*H01L 23/66* (2006.01)
(52) U.S. Cl.
CPC .............. *H01L 2223/6655* (2013.01); *H01L 2223/6672* (2013.01); *H01L 2924/00014* (2013.01)
(58) Field of Classification Search
CPC .............. H01L 25/162; H01L 23/49; H01L 2924/3011; H01L 2224/45099
USPC ........................................ 330/302, 307, 310
See application file for complete search history.

(56) References Cited

U.S. PATENT DOCUMENTS

| | | | | |
|---|---|---|---|---|
| 8,710,928 B2* | 4/2014 | Ng | ................ | H01L 29/4175 330/295 |
| 2009/0039966 A1* | 2/2009 | Chow | ................ | H01L 23/66 330/307 |
| 2013/0271224 A1* | 10/2013 | Puliafico | ................ | H03F 3/19 330/296 |
| 2017/0162525 A1 | 6/2017 | Takagi | | |

\* cited by examiner

AMPLIFIER MODULE

CROSS REFERENCE TO RELATED APPLICATION

The present application is based on and claims the benefit of priority of Japanese Patent Application No. 2017-205094, filed on Oct. 24, 2017, the entire content of which is incorporated herein by reference.

TECHNICAL FIELD

The present invention relates to an amplifier module, in particular, the invention relates to an amplifier module with two or more amplifying units.

BACKGROUND

Figure 6:
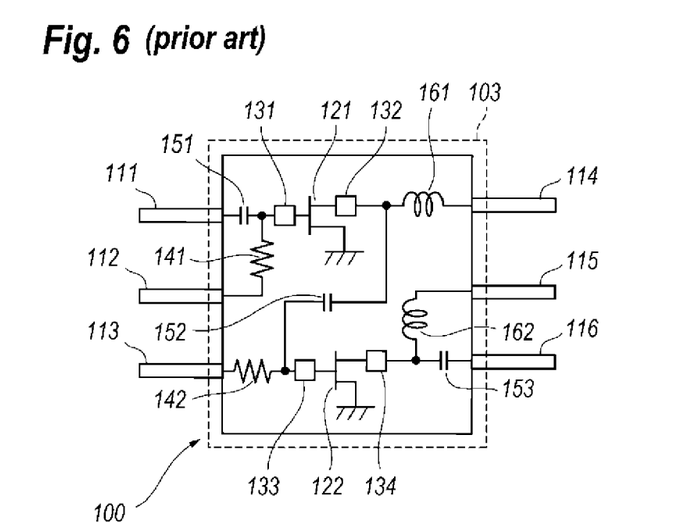
FIG. 6 schematically shows an arrangement of a high frequency amplifier.

Japanese Patent Applications laid open Nos. JP2016-019068A and JP2017-103678A have disclosed amplifier modules operable in radio frequencies (RF). FIG. 6 schematically shows an arrangement of such a high frequency amplifier module. The high frequency amplifier module 100 disclosed therein provides a package 103 and two transistors, 121 and 122, enclosed within the package 103. The package 103, which has a rectangular plane shape, provides terminals, 111 to 113, disposed in one side of the package 103 and other terminals, 114 to 116, in another side of the package 103 facing the former side. The terminal 111 is an input terminal connected with a gate of the first transistor 121 through a capacitor 151 and a matching unit 131; while, a drain of the first transistor 121 is connected with a gate of the second transistor 122 through a capacitor 152 and a matching unit 133. The second transistor 122 in a drain thereof is connected with the terminal 116, which is an output terminal, through a matching unit 134 and a capacitor 153.

The terminal 112, which is coupled with the gate of the first transistor 121 through a resistor 141, supplies a gate bias to the first transistor 121. The terminal 114, which is coupled with the drain of the first transistor 121 through an inductor 161, supplies a drain bias to the first transistor 121. The terminal 113, which is coupled with the gate of the second transistor 122 through a resistor 142 provides a gate bias to the second transistor 122. The terminal 115, which is coupled with the drain of the second transistor 122 through an inductor 162 supplies a drain bias to the second transistor 122.

In the amplifier module 100 shown in FIG. 6, the capacitor 151, the matching unit 131 the transistor 121, the other matching unit 132, and the inductor 161 are disposed on a line connecting two terminals, 111 and 114; while, the resistor 142, the matching unit 133, the second transistor 122, the other matching unit 134, and the capacitor 153 are also disposed on another line connecting two terminals, 113 and 116. Moreover, the former disposition is connected with the latter disposition through the capacitor 152. Thus, the conventional amplifier module 100 shown in FIG. 6 inevitably provides a signal path from the input terminal 111 to the output terminal 116 with a zigzag path, which possibly causes instable performance in the high frequency amplifier 100.

SUMMARY

An aspect of the present application relates to an amplifier module. The amplifier module includes a package, input and output terminals, two or more amplifying units, output bias and input bias terminals. The package has one end and another end opposite to the one end. The input terminal is arranged in the one end; while, the output terminal is arranged in the another end. Two or more amplifying units, which include the first unit and the final unit, are arranged on a reference axis connecting the input terminal with the output terminal and connected in series between the input terminal and the output terminal. Each of the amplifying units provides an input and an output. The output bias terminal is connected with the output of one of the amplifying units except for the final unit to supply an output bias to the one of the amplifying units. The input bias terminal is connected with the input of another one of the amplifying units except for the first unit to supply an input bias to the another one of the amplifying units. A feature of the amplifier module of the present application is that the output bias terminal and the input bias terminal are arranged in axial symmetry with respect to the reference axis in one of the one end and the another end of the package.

BRIEF DESCRIPTION OF THE DRAWINGS

The foregoing and other purposes, aspects and advantages will be better understood from the following detailed description of a preferred embodiment of the invention with reference to the drawings, in which.

DETAILED DESCRIPTION

Next, embodiment according to the present invention will be described as referring to drawings. The present invention, however, is not restricted to the embodiment but has a scope defined in claims and includes all changed and modifications within the scope of the claims and equivalents thereto. In the description of the drawings, numerals or symbols same with or similar to each other will refer to elements same with or similar to each other without duplicating explanations.

Figure 1:
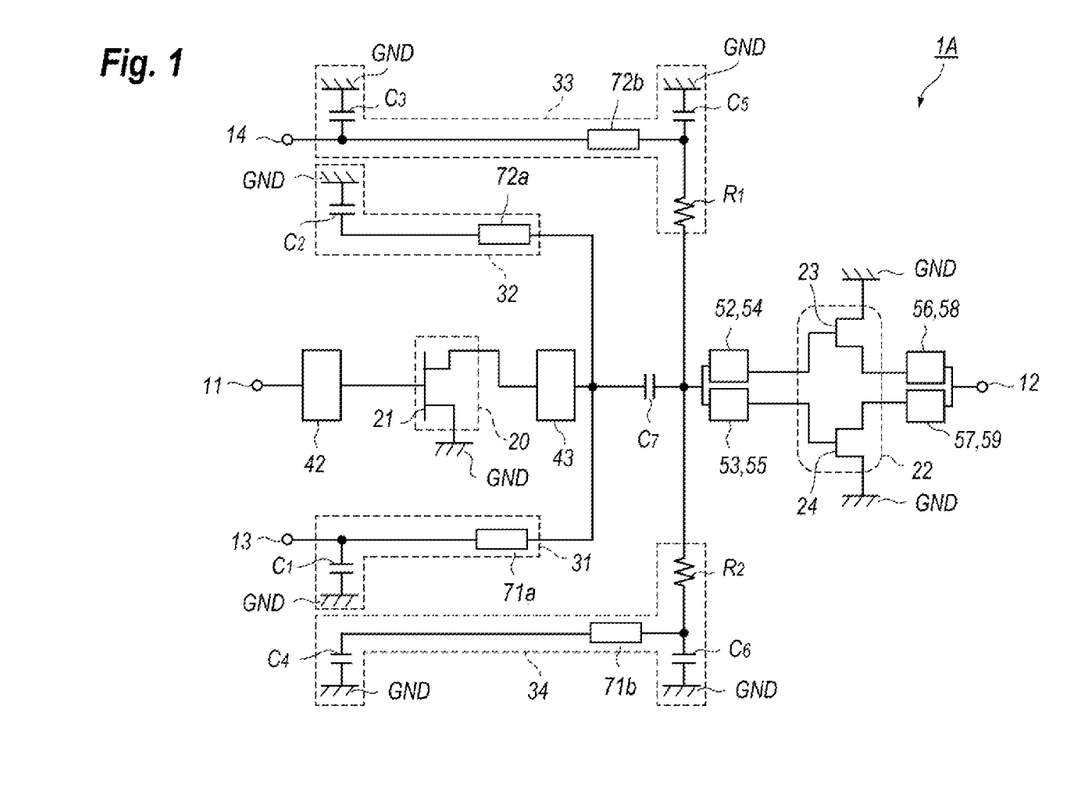
FIG. 1 is a circuit diagram of an amplifier module according to embodiment of the present invention.

FIG. 1 is a circuit diagram of an amplifier module 1A according to embodiment of the present invention. The amplifier module 1A includes at least two amplifying units, 20 and 22, an input terminal 11, and an output terminal 12. The two amplifying units, 20 and 22, are connected in series interposing a coupling capacitor $C_7$ therebetween. Thus, two amplifying units, 20 and 22, the input and output terminals, 11 and 12, and the coupling capacitor $C_7$ are arranged on a reference axis Ax. The input terminal receives a radio frequency (RF) signal in an S-band (2~4 GHz) or an X-band (8~12 GHz) with maximum power of 35 dBm. The RF signal is amplified by the amplifier module 1A and output from the output terminal 12.

The amplifying unit 20, which may be called as the first unit, includes a transistor 21 type of field effect transistor (FET) with a gate as an input thereof, a drain as an output thereof, and a source connected with the ground (GND). The gate is connected with the input terminal 11 via an input matching unit 42. The drain thereof is connected with the coupling capacitor $C_7$ through an inter-stage matching unit 43.

The other amplifying unit 22, which may be called as the final unit, includes two or more transistors, where the present embodiment provides two transistors, 23 and 24, connected in parallel to each other. The transistors, 23 and 24, may be a type of FET and may independently output an amplified signal with power around 52 dBm; which means that the output power of the amplifier module 1A of the embodiment may reach 100 dBm. The gate of the transistors 23, which may be an input of the final unit 22, is connected with the coupling capacitor $C_7$ through inter-stage matching units, 52 and 54. The gate of the other transistor 24, which may be also the input of the final unit 22, is connected with the coupling capacitor $C_7$ through inter-stage matching units, 53 and 55. The RF signal amplified by the first unit 20 may be provided to the inputs of the transistors, 23 and 24, through the coupling capacitor $C_7$ and the inter-stage matching unit, 52 to 55.

The drain of the transistor 23, which may be an output of the final unit 22, is connected with the output terminal 12 through the output matching units, 56 and 58. The drain of the other transistor 24, which may be also the output of the final unit 22, is connected also with the output terminal 12 but through the output matching units, 57 and 59. The sources of the two transistors, 23 and 24, are grounded.

The amplifier module 1A further includes an output bias terminal 13 and an input bias terminal 14, where the output bias terminal 13 may be connected with an output of one of amplifying units except for the final unit through an output bias line 31. Because the present embodiment provides only the first unit 20 and the final unit 22, the output bias terminal 13 is connected with the output of the first unit 20, namely, the drain of the transistor 21. The output bias terminal 13 may supply a drain bias to the output of the first unit 20. The first unit 20 may be biased in an input thereof through a circuit externally connected with the input terminal 11.

An output bias line 31 from the bias terminal 13 to the inter-stage matching unit 43 includes an integrating circuit comprising a transmission line 71a and a capacitor $C_1$. The output bias terminal 13, which is grounded through the capacitor $C_1$, is coupled with the output of the first unit 20 through the transmission line 71a, where the transmission line 71a has a length corresponding to a quarter wavelength $\lambda/4$ of the RF signal. Accordingly, the output bias terminal 13 may be electrically hidden in high frequencies from the inter-stage matching unit 43, or the first unit 20.

The first unit 20 may further provide an output bias dummy line 32 in the output thereof, where the output bias dummy line 32 includes a capacitor $C_2$ and a transmission line 72a with a quarter wavelength of $\lambda/4$. The transmission line 72a in one end thereof may be regarded to be grounded through the capacitor C2; accordingly, the output bias dummy line 32 becomes substantially an open circuit viewing from the output matching unit 43. The output bias line 31 connected in direct to the output bias terminal 13 and the output bias dummy line 32, each connected to the output of the first unit 20, put the first unit 20 therebetween. Specifically, referring to FIG. 2, the first unit 20 is disposed on the reference axis Ax connecting the input terminal 11 with the output terminal 12, and the output bias line 31 and the output bias dummy line 32 symmetrically put the first unit therebetween; that is, the output bias line 31 and the output bias dummy line 32 are disposed in axial symmetry with respect to the reference axis Ax.

The input bias terminal 14 is connected with an input of one of an amplifying unit except for the first unit 20. Specifically, in the present embodiment, the input bias terminal 14 is connected with the input of the final unit 22 through an input bias line 33 that includes an integrating circuit constituted by a transmission line 72b and two capacitors, $C_3$ and $C_5$, connected in respective ends of the transmission line 72b. The input bias line 33 may further include a resistor $R_1$ between the transmission line 72b and the input of the final unit 22. The transmission line 72b in the one end thereof connected with the input bias terminal 14 is grounded through the capacitor $C_3$, while, the transmission line 72b has a length of $\lambda/4$ of the RF signal. Accordingly, the input bias terminal 14 is electrically hidden in high frequencies viewing from the other end of the transmission line 72b, that is, the transmission line 72b may be regarded as an open circuit viewing from the other end thereof. Also, because the resistor $R_1$ and the capacitor $C_5$ are connected in series to the ground viewing from the input of the final unit 22; an input bias for the final unit 22 may be provided through the input bias line 33 without affecting the RF signal entering the final unit 22.

The amplifier module 1A may further provide an input bias dummy line 34 brought from the input of the final unit 22 to a point in front of the output bias terminal 13. The input bias dummy line 34 includes two capacitors, $C_4$ and $C_6$, a transmission line 71b, and a resistor $R_2$. The transmission line 71b in one end thereof is grounded by the capacitor $C_4$; while, the transmission line 71b has a length corresponding to a quarter wavelength $\lambda/4$ of the RF signal. Accordingly, the transmission line 71b may be regarded as an open circuit viewing from the other end connected with the capacitor $C_6$, which means that the input of the final unit 22 is connected with a series circuit of the resistor $R_2$ and the capacitor $C_6$, which constitutes the integrating circuit. The final unit 22 is disposed on the reference axis Ax; while, the input bias line 33 and the input bias dummy line 34 symmetrically put the final unit 22 therebetween; that is, the input bias line 33 and the input bias dummy line 34 are disposed in the axial symmetry with respect to the reference axis Ax.

Figure 2:
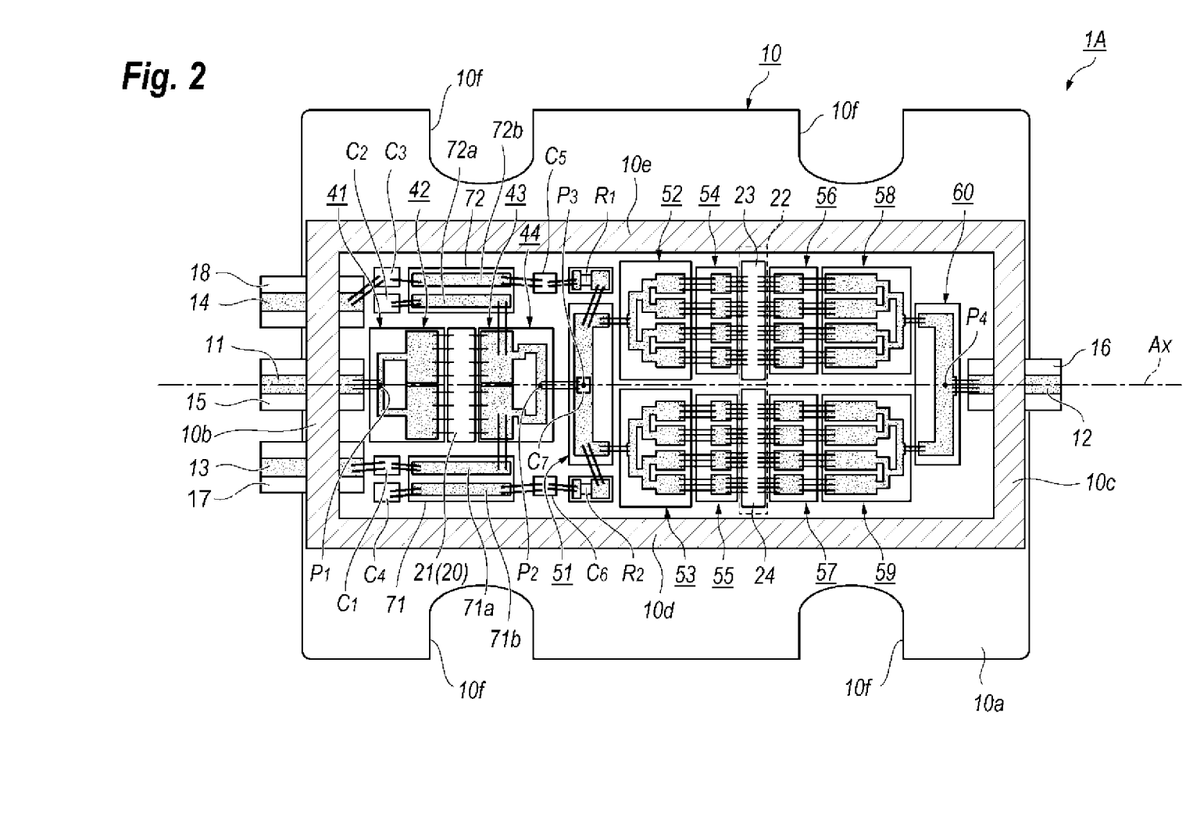
FIG. 2 is a plan view showing an inside of the amplifier module.

FIG. 2 is a plan view showing an inside of the amplifier module 1A. The amplifier module 1A provides a package 10 that includes a bottom 10a made of conductive material and providing the ground GND. That is, the bottom 10a is in contact with the ground metal of a substrate on which the amplifier module 1A is to be mounted. The bottom 10a mounts the first unit 20, the input matching unit 42, the inter-stage matching unit 43, the capacitor C7, the final unit 22, the inter-stage splitter 51, the inter-stage matching units, 52 to 55, the output matching unit 56 to 59, the output bias line 31, the output bias dummy line 32, the input bias line 33, and the input bias dummy line 34 thereon. The package 10 of the present embodiment has a rectangular plane shape demarcated by sides, 10b and 10c, facing to each other and sides, 10d and 10e, also facing to each other. The bottom 10a protrudes from the sides, 10d and 10e, to form cuts 10f for fastening the amplifier module 1A with the substrate. The package 10 may be air-tightly sealed with a lid, which is not illustrated in the figures, where the lid is fixed to tops of the sides, 10b to 10e. The bottom 10a, as described above, may be made of metal, while, the sides, 10b to 10e, and the lid may be made of ceramics.

The package 10 provides the input terminal 11 and the output terminals 12 in the respective sides, 10b and 10c, facing to each other, exactly, the input terminal 11 and the output terminal 12 are disposed onto the reference axis Ax that connects the side 10b with the other side 10c, where the reference axis Ax is disposed in a center of the respective sides, 10b and 10c. The first unit 20 is disposed on the reference axis Ax and connected with the input terminal 11 through the input matching unit 42 that is also disposed on the reference axis Ax. The output terminal 12 is connected with the final unit 22 in the output thereof, where the output unit 22 is disposed on the reference axis Ax. Thus, the amplifier module 1A of the present embodiment disposes primary circuit elements including two amplifying units, 20 and 22, on the reference axis Ax that extends from a center of the side 10b to a center of the other side 10c.

The amplifying units, 20 and 22, where the former is called as the first unit, while, the latter is called as the final unit, are disposed on the reference axis Ax. The first unit 20 may include a transistor 21 that integrates, for instance, eight (8) FET elements arranged perpendicular to the reference axis Ax. The latter unit 22 may include two transistors, 23 and 24, each providing sixteen (16) FET elements also arranged perpendicular to the reference axis Ax.

Figure 3:
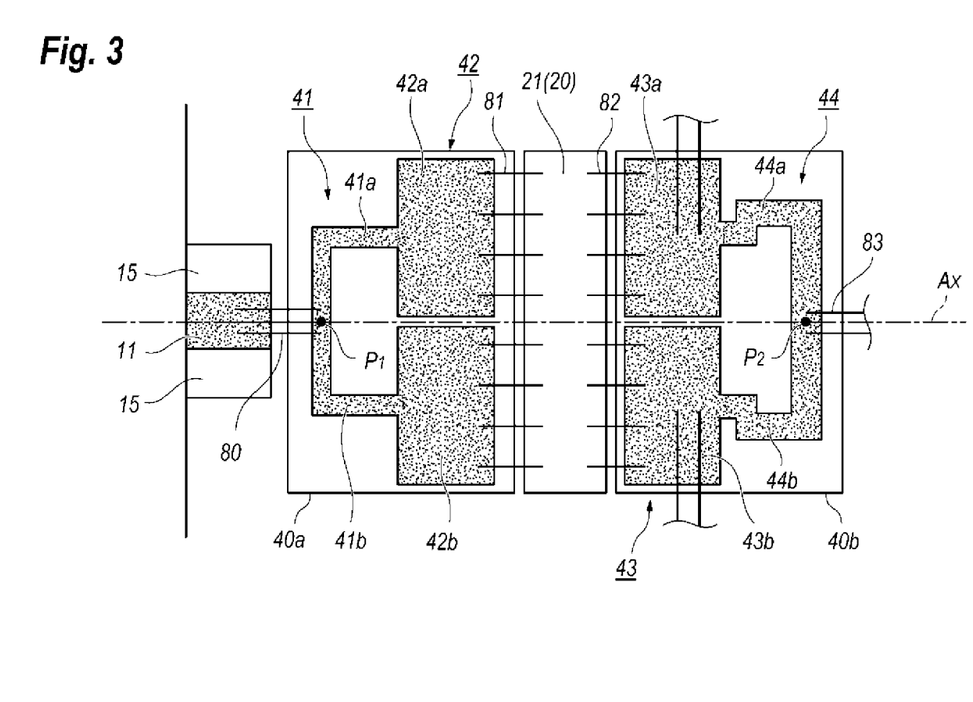
FIG. 3 is a plan view magnifying the first unit.

FIG. 3 is a plan view magnifying the first unit 20. The transistor 21 disposes gate pads and source pads along one side thereof facing the input terminal 11; while, drain pads along another side thereof facing the output terminal 12. The source pads may be directly grounded to the bottom 10a through vias provided in the respective source pads; but the source pads may be wire-bonded to the bottom 10a. As shown in FIG. 3, an input splitter 41 and the input matching unit 42, which are disposed on the reference axis Ax between the transistor 21 in the first unit and the input terminal 11, are metal patterns formed on an insulating slab 40a. The input splitter 41 and the input matching unit 42 are arranged in axial symmetry with respect to the reference axis Ax.

The input splitter 41, which provides a point $P_1$ on the reference axis Ax, has metal patterns, 41a and 41b, each extending from the point $P_1$ along a direction intersecting the reference axis Ax, then bent substantially in a right angle toward the input matching unit 42. Thus, the input splitter 41 has the axial symmetry with respect to the reference axis Ax. The input terminal 11 is wire-bonded to the point $P_1$ with bonding wires 80.

The input matching unit 42 includes two metal patterns, 42a and 42b, each having a rectangular plane shape and disposed in axial symmetry with respect to the reference axis Ax. The metal pattern 41a continues to the metal pattern 42a, exactly, to a center of one side of the rectangle facing the input terminal 11; while, bonding wires 81 connect another side of the rectangle facing the transistor 21 with the gate pads in the transistor 21. The other metal pattern 42b has an arrangement same with that of the former metal pattern 42a. That is, the metal pattern 41b in the input splitter 41 continuous to a center of one side of the rectangle of the metal pattern 42b facing the input terminal 11; while, another side of the rectangle facing the transistor 21 is connected with the gate pads of the transistor 21 with bonding wires 81.

As shown in FIG. 3, the metal patterns, 42a and 42b, have widened areas corresponding to the metal patterns, 41a and 41b, in the input splitter 41, thereby the metal patterns, 42a and 42b, may inherently cause capacitance against the bottom 10a of the package 10. On the other hand, the bonding wires 81 inherently cause inductance. Also, the metal patterns, 41a and 41b, in the input splitter 41 inherently form inductive elements. Accordingly, the metal patterns, 41a and 41b, the metal patterns, 42a and 42b, and the bonding wires 81 may form a matching circuit with a T-shaped L-C-L circuit.

Because the transistor 21 has a lengthened width perpendicular to the reference axis Ax, a center portion of the FET causes a large phase difference of an RF signal provided therein compared with that provided in peripheral portions, which means that only one matching unit becomes hard to match phases between the center portion and the peripheral portions. Accordingly, the metal patterns, 41a and 42a, and the bonding wires 81 matches impedance of a half of FET 21, while, another metal patterns, 41b and 42b, and the bonding wires 81 matches impedance of a rest half of the FET 21.

The amplifier module 1A further provides an inter-stage matching unit 43 and an inter-stage combiner 44 on the reference axis Ax between the transistor 21 and the coupling capacitor $C_7$. The inter-stage matching unit 43 and the inter-stage combiner 44, which are arranged side by side on the reference axis Ax between the transistor 21 and the coupling capacitor $C_7$, include metal patterns, 43a, 43b, 44a, and 44b, formed on the insulating slab 43b common to the inter-stage combiner 44 and the inter-stage matching unit 43 in the axial symmetry with respect to the reference axis Ax.

The inter-stage matching unit 43, which matches output impedance of the transistor 21, includes two metal patterns, 43a and 43b, with a rectangular plane shape arranged side by side as putting the reference axis Ax therebetween. The metal patterns, 43a and 43b, in respective sides facing the transistor 21 are connected with the drain pads of the transistor 21 via bonding wires 82; while other sides facing the coupling capacitor $C_7$ in respective centers thereof continue to the metal patterns, 44a and 44b, in the inter-stage combiner 44. Because the metal patterns, 43a and 43b, are formed wide compared with the metal patterns, 44a and 44b, in the inter-stage combiner 44, which means that the metal patterns, 43a and 43b, may operate as capacitors. While, the bonding wires 82 and the metal patterns, 44a and 44b, with narrowed widths inherently show inductive characteristic. Accordingly, the bonding wires 82, the widened metal patterns, 43a and 43b, and the narrowed metal patterns, 44a and 44b, form respective T-shaped L-C-L circuits to convert impedance thereof.

The inter-stage combiner 44 includes a point $P_2$ from which bonding wires 83 extend to the coupling capacitor $C_7$. The metal patterns, 44a and 44b, extend from the point $P_2$ to a direction intersecting the reference axis Ax, then bent by substantially a right angle toward the transistor 21, bent again in substantially a right angle toward the reference axis Ax, finally bent again also by substantially a right angle toward the transistor 21 and continue to respective center of sides of the metal patterns, 43a and 43b, facing the capacitor $C_7$. The point $P_2$ is wire-bonded with the coupling capacitor $C_7$. A reason same with those for the input matching unit 42 and the input splitter 41 may be applicable to the inter-stage matching unit 43 and the inter-stage combiner 44; that is, in order to partially compensate a phase difference to be occurred between a center portion and peripheral portions of the transistor 21.

Figure 4:
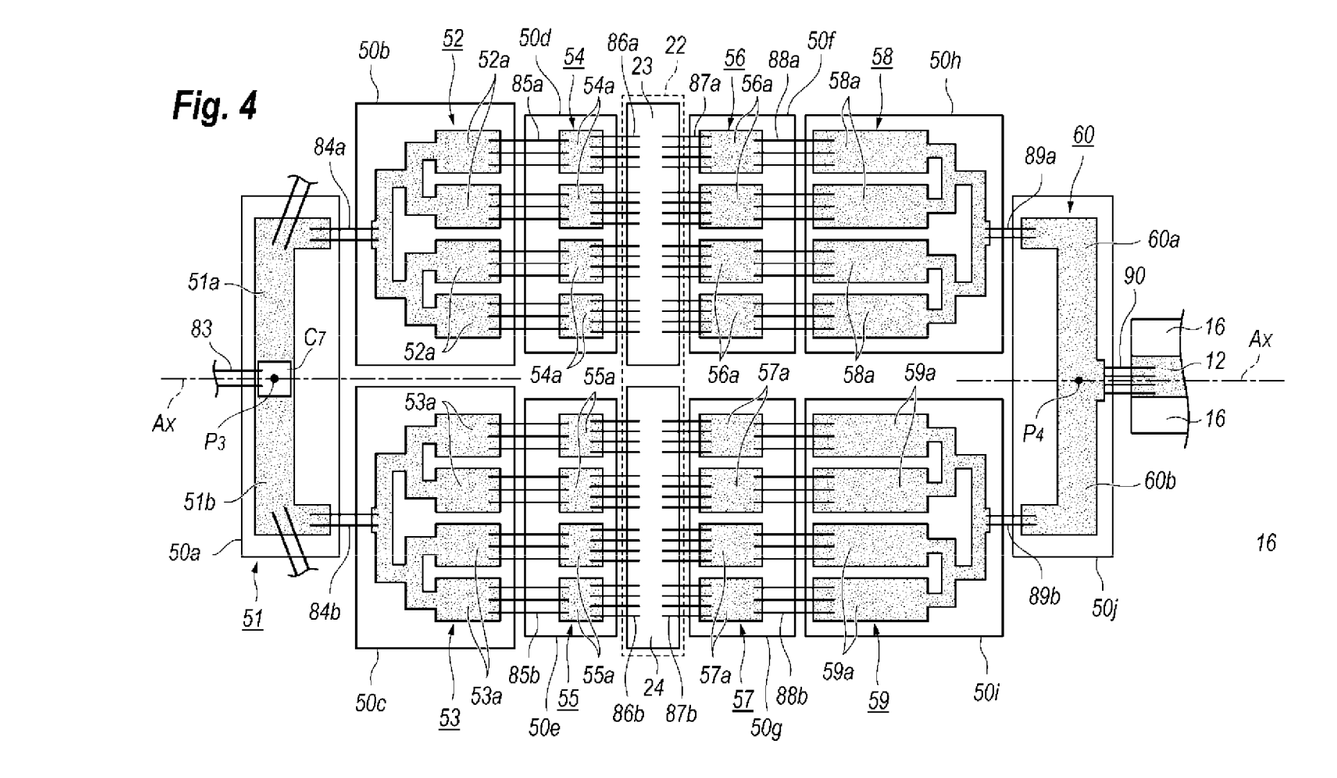
FIG. 4 is a plan view magnifying a portion of the final unit.

FIG. 4 is a plan view magnifying a portion of the final unit 22. As shown in FIG. 4, the amplifier module 1A of the present embodiment disposes, in front of the final unit 22, an inter-stage splitter 51 and inter-stage matching units, 52 to 55, where the inter-stage splitter 51 and the inter-stage matching units, 52 to 55, show axial symmetry with respect to the reference axis Ax.

The inter-stage splitter 51, which is disposed on the reference axis Ax between the final unit 22 and the inter-stage combiner 44, has metal patterns, 51a and 51b, formed on an insulating slab 50a and extending along a direction intersecting the reference axis Ax from a center point $P_3$ then bent in substantially a right angle toward the final unit 22. Thus, the interconnection from the first unit 20 to the final unit 22 is divided into an even number at the point $P_3$. The coupling capacitor $C_7$ of a type of die-capacitor is mounted on the metal patterns, 51a and 51b, at the center point $P_3$. The coupling capacitor $C_7$ in a top electrode thereof is connected with the center point $P_2$ in the inter-stage combiner 44 via bonding wires 83; while, a back electrode thereof is in contact with the metal patterns, 51a and 51b.

The inter-stage matching units 52, which is disposed in one of sides with respect to the reference axis Ax and between the inter-stage splitter 51 and the transistor 23, provide metal patterns 52a, exactly four metal patterns 52a, on an insulating slab 50b. The metal patterns 52a are arranged side by side along the direction intersecting the reference axis Ax, where two of which arranged inward are connected through a thin film resistor, which is not illustrated in FIG. 4, to form a coupler type of Wilkinson coupler. The metal patterns 52a may operate as die-capacitors with respect to the bottom 10a of the package 10.

The inter-stage matching unit 54, which is disposed downstream the inter-stage matching unit 52, includes metal patterns 54a arranged side by side along the direction intersecting the reference axis Ax. The metal patterns 54a are connected with the metal patterns 52a in the former inter-stage matching unit 52 with bonding wires 85a; while, connected with gate pads of the transistor 23 in the final unit 22 via bonding wires 86a. The metal patterns 54a may also operate as die-capacitors against the bottom 10a of the package 10. Thus, the inter-stage matching units, 52 and 54, especially the metal patterns, 52a and 54a, thereof combined with the bonding wires, 85a and 86a, may match input impedance of the transistor 23 in the final unit 22 with output impedance of the first unit 20.

The other inter-stage matching units, 53 and 55, which are disposed in another side with respect to the reference axis Ax and between the inter-stage splitter 51 and the transistor 24 in the final unit 22, have arrangements and functions same with those of the former inter-stage matching units, 52 and 54, described above. That is, the metal patterns, 53a and 55a, formed on the respective insulating slabs, 50c and 50e, combined with bonding wires, 85b and 86b, connecting the former metal patterns 53a with the latter metal patterns 55a, and connecting the latter metal patterns 55a with the gate pads in the second transistor 24 in the final unit 22, may match input impedance of the second transistor 24 with the output impedance of the first unit 20.

Similar to the transistor 21 in the first unit 20, the first and second transistors, 23 and 24, have expanded rectangular plane shape, which causes a phase difference for the RF signal between a center portion and peripheral portions thereof. The matching units, 52 to 55, specifically, the metal patterns, 52a to 55a, in the respective units, 52 to 55, are evenly divided into four (4) elements, which may compensate the phase difference above described and simplifies the match of the input impedance of the final unit 22 with the output impedance of the first unit 20.

The final unit 22 accompanies output matching units, 56 to 59, and the output combiner 60 downstream thereof, where the output matching units, 56 to 59, and the output combiner 60 are disposed in the axial symmetry with respect to the reference axis Ax; specifically, the output matching units, 56 and 58, are disposed in one of sides with respect to the reference axis Ax between the transistor 23 and the output combiner 60, while, the output matching units, 57 and 59, are disposed in another side with respect to the reference axis Ax between the transistor 24 and the output combiner 60.

The output matching unit 56 includes metal patterns 56a arranged on the insulating slab 50f and side by side along the direction intersecting the reference axis Ax, where the metal patterns 56a may be regarded as die-capacitors against the bottom 10a of the package 10. The metal patterns 56a are connected with the drain pads, which is not illustrated in the figures, with bonding wires 87a, while connected with metal patterns 58a with bonding wires, 88a. The output matching unit 58 also includes metal patterns 58a arranged on the insulating slab 50h and side by side along the direction intersecting the reference axis Ax, where the metal patterns 58a may operate as capacitors type of die-capacitor against the bottom 10a of the package 10. The metal patterns 58a are connected with the former metal patterns 56a in the output matching unit 56 by bonding wires 88a. The output matching units, 56 and 58, in particular, the metal patterns thereof, 56a and 58a, combined with the bonding wires, 87a and 88a, may have a function to match output impedance of the amplifier module 1A viewing an inside of the package 10 at the output terminal 12 with the transmission impedance.

The other output matching units, 57 and 59, have arrangements and functions same with those of the output matching units, 56 and 58, above mentioned but are disposed in another side with respect to the reference axis Ax. The output matching units, 57 and 59, in particular, the metal patterns, 57a and 59a, and bonding wires, 87b and 88b, connecting the metal patterns, 57a and 59a, with the drain pads of the second transistor 24 and the output combiner 60 may match the output impedance of the amplifier module 1A viewing an inside of the package 10 at the output terminal 12 with the transmission impedance.

The output combiner 60 includes metal patterns, 60a and 60b, on an insulating slab 50j. The metal patterns, 60a and 60b, extend from a center point $P_4$ along the direction intersecting the reference axis Ax but opposite sides with respect to the reference axis Ax. That is, the metal patterns, 60a and 60b, are disposed in the axial symmetry with respect to the reference axis Ax. The metal patterns 58a in the output matching unit 58 are connected with an end of the metal pattern 60a with bonding wires 89a collected into a single pattern. Also, the metal patterns 59a in the output matching unit 59 are connected with an end of the other metal pattern 60b with bonding wires 89b collected into a single pattern. The metal patterns, 60a and 60b, are connected with the output terminal 12 through bonding wires 90 at the center point $P_4$ thereof.

Referring to FIG. 2 again, the package 10 further provides the output bias terminal 13 and the input bias terminal 14 in the front wall 10b thereof, where the output bias terminal 13 and the input bias terminal 14 sandwich the input bias terminal 11 therebetween and are symmetrically disposed with respect the reference axis Ax, namely, the input terminal 11.

The output bias terminal 13, which is formed on an insulator 17, passes the front wall 10b of the package 10; that is, one end of the output bias terminal 13 locates within the package 10, while, the other end thereof is exposed outwardly. The output bias terminal 13 is connected with an output of one of amplifying units implemented in the amplifier module 1A but except for the final unit 22. In the present embodiment, the output bias terminal 13 is connected with the output of the first unit 20.

The input bias terminal 14, which is also formed on an insulator 18, passes the front wall 10b of the package 10, that is, one end thereof exists within the package 10, while, the other end is exposed outwardly. The input bias terminal 14 is connected with an input of one of the amplifying units implemented within the amplifier module 1A but except for the first unit 20. The present embodiment connects the input bias terminal 14 with the input of the final unit 22.

Figure 5:
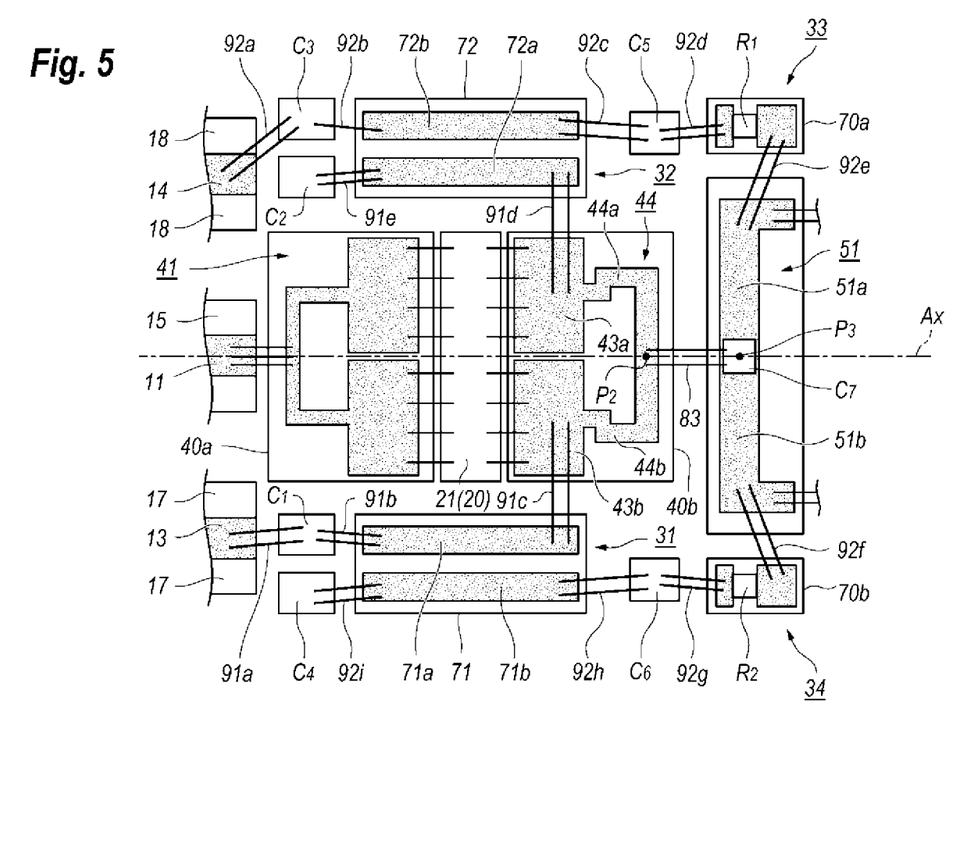
FIG. 5 is a plan view magnifying a portion around the first unit.

FIG. 5 is a plan view magnifying a portion around the front wall 10b and the first unit 20. As shown in FIG. 5, the output bias dummy line 32 and the input bias line 33 are arranged in one side with respect to the reference axis Ax; while, the output bias line 31 and the input bias dummy line 34 are disposed in another side with respect to the reference axis Ax.

The output bias line 31 extends to the metal pattern 43b of the inter-stage matching unit 43 from the output bias terminal 13, while, the output bias dummy line 32 extends to the metal pattern 43a of the inter-stage matching unit 43 to a point in front of the input bias terminal 14. The output bias line 31 and the output bias dummy line 32 are disposed in and have arrangements of the axial symmetry with respect to the reference axis Ax. Also, the input bias line 33 extends to the input bias terminal 14 from the metal pattern 51a of the inter-stage splitter 51, while, the input bias dummy line 34 extends to just in front of the output bias terminal 13 from the other metal pattern 51b of the inter-stage splitter 51. The input bias line 33 and the input bias dummy line 34 have arrangements of and are disposed in the axial symmetry with respect to the reference axis Ax.

The output bias line 31 is disposed between the input bias dummy line 34 and the transistor 21 in the first unit 20 and the insulating slabs, 40a and 40b, for the input matching unit 42 and the inter-stage combiner 44, respectively. The output bias dummy line 32 is disposed between the input bias line 33 and the transistor 21 and the insulating slabs, 40a and 40b.

The output bias line 31, which is connected with the metal pattern 43b of the inter-stage matching 43, includes a capacitor $C_1$ and a transmission line 71a that is formed on the insulating slab 71. The capacitor $C_1$, which is a type of die-capacitor, is mounted between the output bias terminal 13 and the insulating slab 71. Bonding wires 91a connect a top electrode of the capacitor $C_1$ with the output bias terminal 13, while boding wires 91b connect the top electrode thereof with the transmission line 71a. A back electrode of the capacitor $C_1$ is in contact with the bottom 10a of the package 10. The transmission line 71a in another end thereof is connected with the metal pattern 43b of the inter-stage matching unit 43 with bonding wires 91c.

The output bias dummy line 32, which is disposed in a side of the input bias terminal 14 opposite to a side where the output bias terminal 13 is provided with respect to the reference axis Ax, is connected with the metal pattern 43a of the inter-stage matching unit 43, and terminated in front of the input bias terminal 14 by the capacitor $C_2$ type of die-capacitor. That is, the output bias dummy line 32 includes the capacitor $C_2$ and the transmission line 72a connected in series to the capacitor $C_2$ via bonding wires 91e. The transmission line 72a, which is a metal pattern formed on the insulating slab 72, is disposed in the axial symmetry for the transmission line 71a in the output bias line 31 with respect to the reference axis Ax. The capacitor $C_2$ is also disposed in the axial symmetry for the capacitor $C_1$ in the output bias line 31 with respect to the reference axis Ax, that is, the capacitor $C_2$ is put between the input bias terminal 14 and the insulating slab 72. The transmission line 72a in the other end thereof is connected with the metal pattern 43a in the inter-stage matching unit 43 via bonding wires 91d.

The input bias line 33, which is disposed in a side where the input bias terminal 14 is provided in the front wall 10b with respect to the reference axis Ax, includes capacitors, $C_3$ and $C_5$, an transmission line 72b, and a resistor $R_1$. The transmission line 72b is a metal pattern formed on the insulating slab 72 along the reference axis Ax. The capacitor $C_3$, which is put between the input bias terminal 14 and the insulating slab 72, has an arrangement of die-capacitor with a top electrode thereof connected with the input bias terminal 14 via bonding wires 92a and an end of the transmission line 72 via bonding wires 92b.

The resistor $R_1$, which is placed in side by side for the inter-stage splitter 51, is a type of thin film resistor formed on the insulating slab 70a with two electrodes, one of which is connected with the metal pattern 51a of the inter-stage splitter 51 via bonding wires 92e, while the other is connected with the capacitor $C_5$ via bonding wires 92d. The capacitor $C_5$, which is assembled between the insulating slab 70a and another insulating slab 72, is a type of die-capacitor with a top electrode connected with the resistor $R_1$ via bonding wires 92d and with an end of the transmission line 72b via bonding wires 92c.

The input bias dummy line 34 is disposed in one side with respect to the reference axis Ax that is opposite to the side where the input bias terminal 14 is provided in the front wall 10b; that is, the side where the output bias terminal 13 is provided in the front wall 10b. The input bias dummy line 34 is terminated in front of the output bias terminal 13. The input bias dummy line 34 includes two capacitors, $C_4$ and $C_6$, the transmission line 71b, and the resistor $R_2$. The transmission line 71b is a metal pattern formed on the insulating slab 71 and extending parallel to the reference axis Ax. The capacitor $C_4$, which has a type of die-capacitor, is disposed between the output bias terminal 13 and the insulating slab 71, that is, in front of the output bias terminal 13 so as to be make an axial symmetry for the capacitor $C_3$ with respect to the reference axis Ax. The top electrode thereof is connected with the end of the transmission line 71b with bonding wires 92i.

The resistor $R_2$, which is placed in side by side of the inter-stage splitter 51, also is a type of thin film resistor formed on the insulating slab 70b with two electrodes, one of which is connected with the metal pattern 51b of the inter-stage splitter 51 via bonding wires 92f, while the other is connected with the capacitor $C_6$ via bonding wires 92g. The capacitor $C_6$, which is assembled between the insulating slab 70b and another insulating slab 71, has a type of die-capacitor with a top electrode connected with the resistor $R_2$ via the bonding wires 92g and with an end of the transmission line 71b via bonding wires 92h.

In the present embodiment thus described, the bonding wires, 92e and 92f, connect the resistors, $R_1$ and $R_2$, with the inter-stage splitter 51; but, in an alternative, the bonding wires, 92e and 92f, connect the resistors, $R_1$ and $R_2$, with the inter-stage matching units, 52 and 53.

Next, advantages of the amplifier module 1A of the present invention will be described comparing with a conventional amplifier. Conventionally, an amplifier having two or more amplifying units connected in series, or two or more transistors connected in parallel have been used in an application where higher operational frequencies and greater output power are requested. In such a system, transistors are enclosed in respective packages independently, and matching units, splitters, and/or combiners are provided outside of the packages of the transistors. Because those additional units are independent of the packages of the transistors, input biases and output biases are easily and simply connected with inputs and/or outputs of the respective transistors.

However, when an amplifier module implements two or more amplifying units within one package, inputs of respective amplifying units except for the first unit and outputs of respective amplifying units except for the final unit becomes inoperable from an outside of the package. A technique how input biases and output biases are supplied to respective amplifying units within the package becomes a left subject. An amplifier module disclosed in the prior document bends the signal path in the package in zigzag to pull the input of the final unit and the output of the first unit out of the package. However, such a zigzag path possibly degrades quality of an RF signal to be amplified.

The amplifier module 1A of the embodiment arranges two or more amplifying units, where the embodiment sets the first and final units, 20 and 22, on the reference axis Ax and connects those amplifying units, 20 and 22, in series between the input terminal 11 and the output terminal 12. The output bias terminal 13, which supplies the output bias to the first unit 20, and the input bias terminal 14, which supplies the input bias to the final unit 22, are disposed in one of the sides 10b that also disposes the input terminal 11 and in the axial symmetry with respect to the reference axis Ax.

Because the input terminal 11 and the output terminal 12 are arranged on the reference axis Ax, and the amplifying units, 20 and 22, are also disposed on the reference axis Ax; the signal path from the input terminal 11 to the output terminal 12 becomes straight. Moreover, the embodiment disposes the input bias terminal 13 and the output bias terminal 14 in the front wall 10b where the input terminal 11 is provided; however, those bias terminals, 13 and 14, may be arranged in the rear wall 10c where the output terminal 12 is disposed. Even when those bias terminals, 13 and 14, are disposed in the rear wall, the bias terminals, 13 and 14, makes the axial symmetry with respect to the reference axis Ax, that is, to the output terminal 12.

The amplifier module 1A arranges the input bias line 33 and the input bias dummy line 34 in the axial symmetry with respect to the reference axis Ax not only in the physical disposition thereof but also in the electrical disposition. That is, the lines, 33 and 34, are pulled out from the inter-stage splitter 51 toward the respective sides and grounded in front of the input bias terminal 14 and the output bias terminal 13 by the capacitors, $C_3$ and $C_4$. Viewing the capacitors, $C_3$ and $C_4$, from the inter-stage splitter 51, respective filters each including the resistors, $R_1$ and $R_2$, the capacitors, $C_5$ and $C_6$, and the transmission lines, 72b and 71b, are interposed between the inter-stage splitter 51 and the capacitors, $C_3$ and $C_4$. Accordingly, even when the final unit 22 includes two transistors, 23 and 24, connected in parallel with respect to the first unit 20 and/or the input bias terminal 14, two transistors, 23 and 24, may be regarded to be balanced with respect to the RF signal provided from the first unit 20. When an amplifier module omits the input bias dummy line, two transistors, 23 and 24, becomes unbalanced because an arrangement with respect to the transistor 23 connected with the metal pattern 51a and another arrangement with respect to the transistor 24 connected with the metal pattern 51b become difference from each other.

Similarly, the amplifier module 1A of the embodiment arranges the output bias line 31 and the output bias dummy line 32 in the axial symmetry with respect to the reference axis Ax not only in the physical disposition thereof but also in the electrical disposition. That is, the lines, 31 and 32, are pulled out from the inter-stage matching unit 43 toward the respective sides and grounded, or substantially grounded in front of the input bias terminal 14 and the output bias terminal 13 by the capacitors, $C_1$ and $C_2$. Viewing those capacitors, $C_1$ and $C_2$, from the inter-stage matching unit 43; respective filters including the transmission lines, 72a and 71a, and the capacitors, $C_1$ and $C_2$, are interposed between the inter-stage matching unit 43 and the ground. Accordingly, even when the inter-stage matching unit 43 is divided into two parts and the respective parts in outputs thereof are necessary to be biased independently because the transistor 21 in the first unit 20 has an elongated size; the two parts of the transistor 21 in high frequency conditions thereof may be evenly set, thereby the transistor 21 may stably operate in high frequencies.

The amplifier module 1A of the present embodiment provides two inter-stage matching units, 52 and 53, independently on the respective insulating slabs, 50b and 50c. However, those inter-stage matching units, 52 and 53, may be integrated on a unique insulating slab. Still in an alternative, the inter-stage splitter 51, and two inter-stage matching units, 52 and 53, may be integrated on a unique insulating slab. Such an arrangement removes the bonding wires, 84a and 84b; but those bonding wires, 84a and 84b, give substantially no contribution to the impedance compensation. Similarly, two output matching units, 58 and 59, may be integrated on a unique insulating slab, and the output combiner 60 may be also integrated with the output matching units, 58 and 59, on a unique insulating slab. In such an arrangement, the bonding wires, 89a and 89b, may be omitted.

While particular embodiment of the present invention has been described herein for purposes of illustration, many modifications and changes will become apparent to those skilled in the art. For instance, the amplifier module 1A of the embodiment is a type of two units, namely, the first unit 20 and the final unit 22; an amplifier module of the invention may provide three or more units connected in series between the input terminal and the output terminal. As the number of the amplifying stage increase, which means that a total gain of the amplifier module becomes larger, the operation of the amplifier module becomes unstable. The spirit according to the present invention becomes effective for such a high gain module. In such an arrangement, additional output bias terminal and input bias terminal may be disposed in the rear wall of the housing so as to make the axial symmetry with respect to the output terminal. Accordingly, the appended claims are intended to encompass all such modifications and changes as fall within the true spirit and scope of this invention.

What is claimed is:

1. An amplifier module, comprising:
a package having one end and another end opposite to the one end;
an input terminal arranged in the one end of the package;
an output terminal arranged in the another end of the package, the output terminal and the input terminal being arranged on a reference axis that connects the output terminal with the input terminal;
two or more amplifying units including a first unit and a final unit, the amplifying units each arranged on the reference axis and connected in series between the input terminal and the output terminal, the amplifying units each having an input and an output;

an output bias terminal connected with the output of one of the amplifying units except for the final unit, the output bias terminal supplying an output bias to the one of the amplifying units; and an input bias terminal connected with the input of another one of the amplifying units except for the first unit, the input bias terminal providing an input bias to the another one of the amplifying units, wherein the output bias terminal and the input bias terminal are arranged in axial symmetry with respect to the reference axis in one of the one end and the another end of the package.

2. The amplifier module according to claim 1, further including an input bias line and an input bias dummy line, the input bias line connecting the input bias terminal with the input of the final unit, the input bias dummy line being connected with the input of the final unit and terminated near the output bias terminal via a capacitor, wherein the first unit is disposed between the input bias line and the input bias dummy line.

3. The amplifier module according to claim 2, wherein the input bias line and the input bias dummy line are integrating circuits with arrangement substantially same with each other.

4. The amplifier module according to claim 2, further including an output bias line and an output bias dummy line, the output bias line connecting the output bias terminal with the output of the first unit, the output bias dummy line being connected with the output of the first unit and terminated near the input bias terminal via a capacitor, wherein the first unit is disposed between the output bias line and the output bias dummy line.

5. The amplifier module according to claim 4, wherein the output bias line and the output bias dummy line are integrating circuits with arrangements substantially same with each other.

6. The amplifier module according to claim 4, wherein the first unit is disposed between a pair of the input bias line and the output bias dummy line and a pair of the input bias dummy line and the output bias line.

7. The amplifier module according to claim 6, wherein the input bias line, the input bias dummy line, the output bias line, and the output bias dummy line are integrating circuits.

8. The amplifier module according to claim 1, further including an input bias line and an input bias dummy line, the input bias line connecting the input bias terminal with the input of the one of the amplifying units, the input bias dummy line being connected with the input of the one of the amplifying units and terminated near the output bias terminal via a capacitor, wherein the first unit or the final unit disposed closer to the input bias terminal and the output bias terminal is disposed between the input bias line and the input bias dummy line.

9. The amplifier module according to claim 8, wherein the input bias line and the input bias dummy line are integrating circuits with arrangements substantially same with each other.

10. The amplifier module according to claim 1, further including an output bias line and an output bias dummy line, the output bias line connecting the output bias terminal with the output of the another one of the amplifying units, the output bias dummy line being connected with the output of the another one of the amplifying units and terminated near the input bias terminal via a capacitor, wherein the first unit or the final unit arranged closer to the input bias terminal and the output bias terminal is disposed between the output bias line and the output bias dummy line.

11. The amplifier module according to claim 10, wherein the output bias line and the output bias dummy line are integrating circuits with arrangements substantially same with each other.

12. The amplifier module according to claim 10, further including an input bias line and an input bias dummy line, the input bias line connecting the input bias terminal with the input of the one of the amplifying units, the input bias dummy line being connected with the input of the one of the amplifying units and terminated near the output bias terminal via a capacitor, wherein the first unit or the final unit arranged closer to the input bias terminal and the output bias terminal is disposed between a pair of the input bias line and the output bias dummy line and a pair of the input bias dummy line and the output bias line.

13. The amplifier module according to claim 12, wherein the input bias line, the input bias dummy line, the output bias line, and the output bias dummy line are integrating circuits.

* * * * *